United States Patent
Kim et al.

(10) Patent No.: US 11,127,646 B2
(45) Date of Patent: Sep. 21, 2021

(54) FAN-OUT SEMICONDUCTOR PACKAGE

(71) Applicant: SAMSUNG ELECTRONICS CO., LTD., Suwon-si (KR)

(72) Inventors: Joonsung Kim, Suwon-si (KR); Doohwan Lee, Suwon-si (KR); Jinseon Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/681,320

(22) Filed: Nov. 12, 2019

(65) Prior Publication Data

US 2020/0161204 A1 May 21, 2020

(30) Foreign Application Priority Data

Nov. 16, 2018 (KR) .................. 10-2018-0141648

(51) Int. Cl.
| | |
|---|---|
| *H01L 23/31* | (2006.01) |
| *H01L 23/13* | (2006.01) |
| *H01L 23/498* | (2006.01) |
| *H01L 23/552* | (2006.01) |
| *H01L 25/10* | (2006.01) |
| *H01L 23/538* | (2006.01) |
| *H01L 23/495* | (2006.01) |
| *H01L 23/00* | (2006.01) |

(52) U.S. Cl.
CPC ......... *H01L 23/3128* (2013.01); *H01L 23/13* (2013.01); *H01L 23/49816* (2013.01); *H01L 23/49822* (2013.01); *H01L 23/49827* (2013.01); *H01L 23/49838* (2013.01); *H01L 24/08* (2013.01); *H01L 2224/08235* (2013.01)

(58) Field of Classification Search
CPC . H01L 23/3128; H01L 23/5389; H01L 23/13; H01L 23/49816; H01L 23/49827; H01L 23/49838; H01L 23/49822; H01L 24/08; H01L 2224/08235
See application file for complete search history.

(56) References Cited

U.S. PATENT DOCUMENTS

| | | |
|---|---|---|
| 7,041,534 B2 | 5/2006 | Chao et al. |
| 2013/0075902 A1 | 3/2013 | Chow et al. |
| 2017/0103951 A1 | 4/2017 | Lee et al. |
| 2018/0053036 A1* | 2/2018 | Baek ............... H01L 21/561 |
| 2018/0082933 A1* | 3/2018 | Ko ................ H01L 23/16 |

FOREIGN PATENT DOCUMENTS

KR 10-2017-0043440 A 4/2017

* cited by examiner

*Primary Examiner* — Herve-Louis Y Assouman
(74) *Attorney, Agent, or Firm* — Sughrue Mion, PLLC

(57) ABSTRACT

A fan-out semiconductor package includes a semiconductor chip, an encapsulant covering the semiconductor chip, a connection structure disposed below the semiconductor chip, and first and second metal pattern layers disposed on different levels on the semiconductor chip, wherein the first metal pattern layer is provided to electrically connect to an electrical connection member such as a frame, provided for electrical connection of the package in a vertical direction by a path via the second metal pattern layer.

20 Claims, 13 Drawing Sheets

FAN-OUT SEMICONDUCTOR PACKAGE

CROSS-REFERENCE TO RELATED APPLICATION

This application claims benefit of priority to Korean Patent Application No. 10-2018-0141648 filed on Nov. 16, 2018 in the Korean Intellectual Property Office, the disclosure of which is incorporated herein by reference in its entirety.

BACKGROUND

The present disclosure relates to a semiconductor package, e.g., a fan-out semiconductor package.

One of main trends in technological development related to semiconductor chips in recent years is to reduce the size of components. Therefore, in the field of packaging, it is necessary to implement a large number of pins having a small size in accordance with a surge of demand for small semiconductor chips and the like.

To meet this requirement, one of proposed semiconductor package technologies is a fan-out semiconductor package. The fan-out semiconductor package may redistribute an electrical connection structure beyond an area on which a semiconductor chip is disposed, thereby enabling a large number of pins to be implemented while maintaining a small size.

Meanwhile, recently, in order to improve the electrical characteristics of the premium smartphone product and efficiently utilize space, and to apply a package on package (POP) of a semiconductor package including different semiconductor chips, there is the requirement for forming the backside circuit in a semiconductor package structure, and the requirements for the line and space of the backside circuit are increasing in accordance with the demand for the enhancement of the characteristics of the chip and the reduction in the area.

SUMMARY

An aspect of the present disclosure is to provide a fan-out semiconductor package having a backside circuit, capable of applying to a package-on-package (POP) structure, capable of ensuring excellent signal and power characteristics, and also capable of securing weight lightening, thinning, shortening, and compactness of the product.

An aspect of the present disclosure is to provide first and second metal pattern layers on different levels disposed on a backside side of the package, wherein the first metal pattern layer is provided to electrically connect to an electrical connection member such as a frame, provided for electrical connection of the package in a vertical direction by a path via the second metal pattern layer.

According to an aspect of the present disclosure, a fan-out semiconductor package includes a frame having a through-hole and including one or more wiring layers; a semiconductor chip disposed in the through-hole of the frame; a connection structure disposed below each of the frame and the semiconductor chip, and including one or more redistribution layers; an encapsulant covering an upper surface of each of the frame and the semiconductor chip, and filling a space between a wall surface of the through-hole of the frame and a side surface of the semiconductor chip; a first metal pattern layer disposed on an upper surface of the encapsulant; an insulating material disposed on the upper surface of the encapsulant and covering the first metal pattern layer; and a second metal pattern layer disposed on an upper surface of the insulating material, wherein the first metal pattern layer is located on a level between a lower surface of the second metal pattern layer and an upper surface of an uppermost wiring layer among the wiring layers of the frame, and the first metal pattern layer is electrically connected to the uppermost wiring layer by a path via the second metal pattern layer.

According to another aspect of the present disclosure, a fan-out semiconductor package includes a connection structure including one or more redistribution layers; a semiconductor chip disposed on the connection structure and having connection pads electrically connected to the redistribution layers; an electrical connection member disposed on the connection structure, and electrically connected to the redistribution layer to provide a vertical electrical connection path; an encapsulant disposed on the connection structure and covering at least a portion of each of the semiconductor chip and the electrical connection member; a first metal pattern layer disposed on the encapsulant; an insulating material disposed on the encapsulant and covering the first metal pattern layer; and a second metal pattern layer disposed on the insulating material, wherein the first metal pattern layer is located on a level between a lower surface of the second metal pattern layer and an upper surface of the electrical connection member, and the first metal pattern layer is electrically connected to the electrical connection member by a path via the second metal pattern layer.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
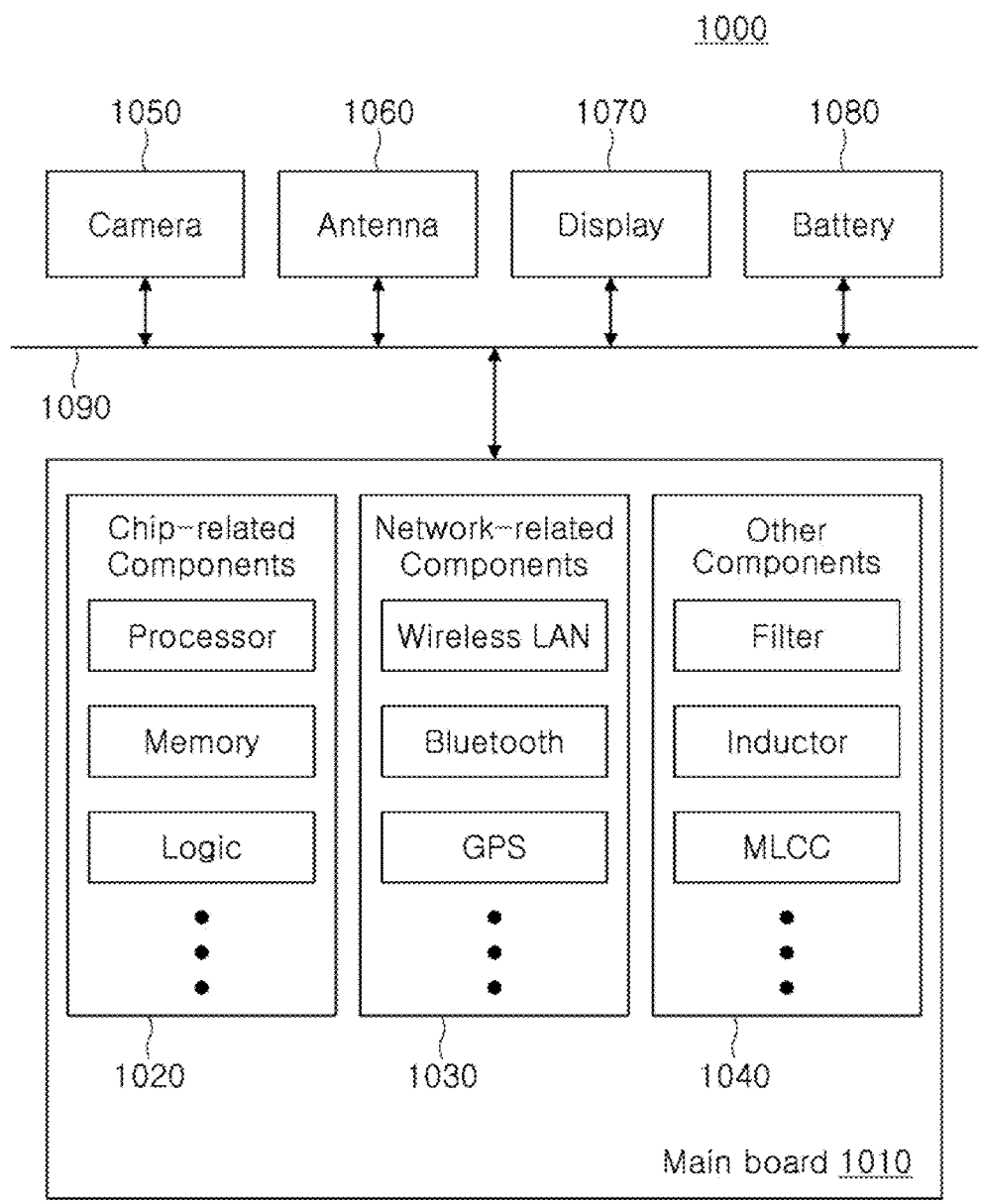
FIG. 1 is a schematic block diagram illustrating an example of an electronic device system.

Hereinafter, embodiments of the present disclosure will be described as follows with reference to the attached drawings. The shape and size of elements in the drawings may be exaggerated or reduced for clarity.

Electronic Device

FIG. 1 is a block diagram schematically illustrating an example of an electronic device system.

Referring to the drawings, an electronic device 1000 may include a main board 1010. The main board 1010 may be physically and/or electrically connected to chip-related components 1020, network-related components 1030, and other components 1040. They may be also combined with other components to be described later to form various signal lines 1090.

The chip-related components 1020 may include a memory chip, such as a volatile memory (e.g., DRAM), a non-volatile memory (e.g., ROM), a flash memory, etc.; an application processor chip, such as a central processor (e.g., CPU), a graphics processor (e.g., GPU), a digital signal processor, a cryptographic processor, a microprocessor, a microcontroller, etc.; a logic chip, such as an analog-to-digital converter, an application-specific IC (ASICs), etc.; and the like, but are not limited thereto, and other types of chip-related components may be included. These components 1020 may be combined with each other.

The network-related components 1030 may include Wi-Fi (IEEE 802.11 family, etc.), WiMAX (IEEE 802.16 family, etc.), IEEE 802.20, long term evolution LTE, Ev-DO, HSPA+, HSDPA+, HSUPA+, EDGE, GSM, GPS, GPRS, CDMA, TDMA, DECT, Bluetooth, 3G, 4G, 5G, and any other wireless and wired protocols designated as the later ones, but are not limited thereto, and any of other various wireless or wired standards or protocols may be further included. The network-related components 1030 may be combined with the chip-related components 1020, as well.

Other components 1040 may include a high frequency inductor, a ferrite inductor, a power inductor, a ferrite bead, a low temperature co-firing ceramic LTCC, an electromagnetic interference EMI filter, and a multilayer ceramic condenser MLCC, but is not limited thereto, and may include other passive components used for various other purposes. Other components 1040 may be combined with each other, in addition to the chip-related components 1020 and/or the network-related components 1030.

Depending on the type of the electronic device 1000, the electronic device 1000 may include other components that may or may not be physically and/or electrically connected to the main board 1010. Other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage device (e.g., a hard disk drive) (not illustrated), a compact disk CD (not illustrated), and a digital versatile disk DVD (not illustrated), and the like, but is not limited thereto, and other components used for various purposes may be included, depending on the type of the electronic device 1000.

The electronic device 1000 may be a smartphone, a personal digital assistant, a digital video camera, a digital still camera, a network system, a computer, a monitor, a tablet computer, a laptop computer, a netbook, a television, a video game, a smartwatch, an automotive, and the like, but is not limited thereto, and may be any other electronic device that processes data.

Figure 2:
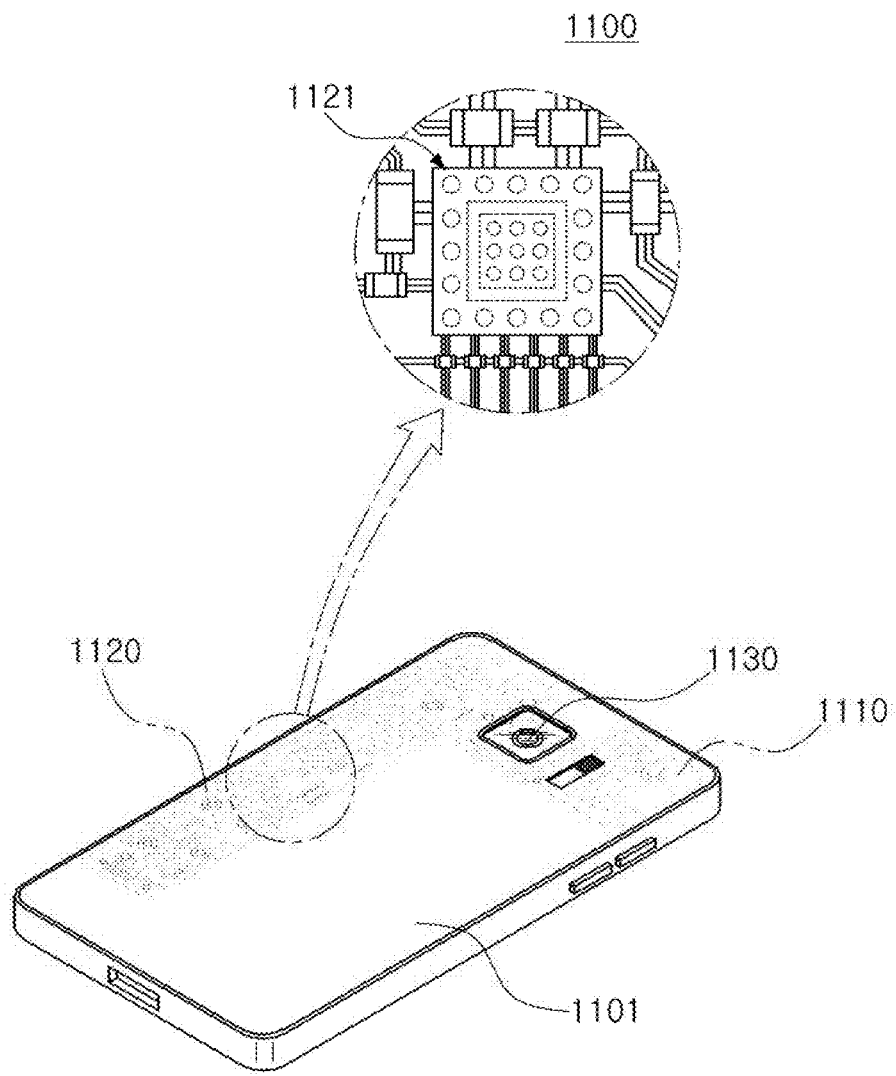
FIG. 2 is a schematic perspective view illustrating an example of an electronic device.

FIG. 2 is a perspective view schematically illustrating an example of an electronic device.

Referring to the drawings, a semiconductor package may be applied to various electronic devices as described above for various purposes. For example, a printed circuit board 1110, such as a main board, may be included in a body 1101 of a smartphone 1100. Further, various components 1120 may be physically and/or electrically connected to the printed circuit board 1110. In addition, other components that may or may not be physically and/or electrically connected to the printed circuit board 1110, such as a camera 1130, may be housed within the body 1101. A portion of the components 1120 may be chip-related components, for example, but not limited to, a semiconductor package 1121. The electronic device is not necessarily limited to the smartphone 1100, and may be other electronic device as described above.

Semiconductor Package

In general, a semiconductor chip may have many microelectronic circuits integrated therein, but does not necessarily serve as a finished product of a semiconductor in itself, and the semiconductor chip may be damaged by an external physical or chemical impact. Therefore, the semiconductor chip itself may be not used as it is and may be packaged and used as an electronic device or the like in such a packaged state.

Semiconductor packaging may be necessary, since there may be a difference in a circuit width between a semiconductor chip and a main board of the electronic device in view of an electrical connection. Specifically, for a semiconductor chip, the size of the connection pad and the interval between connection pads are very small and narrow, whereas the size of the component mounting pad and the interval between component mounting pads are much larger and wider than the scale of the semiconductor chip, respectively. Therefore, since it is difficult to directly mount a semiconductor chip on such a main board, there is a need for a packaging technique which may buffer the difference in a circuit width therebetween.

A semiconductor package manufactured by such a packaging technique may be classified as a fan-in semiconductor package or a fan-out semiconductor package, depending on the structure and use thereof.

Hereinafter, the fan-in semiconductor package and the fan-out semiconductor package will be described in more detail with reference to the drawings.

Fan-in Semiconductor Package

Figure 3A:
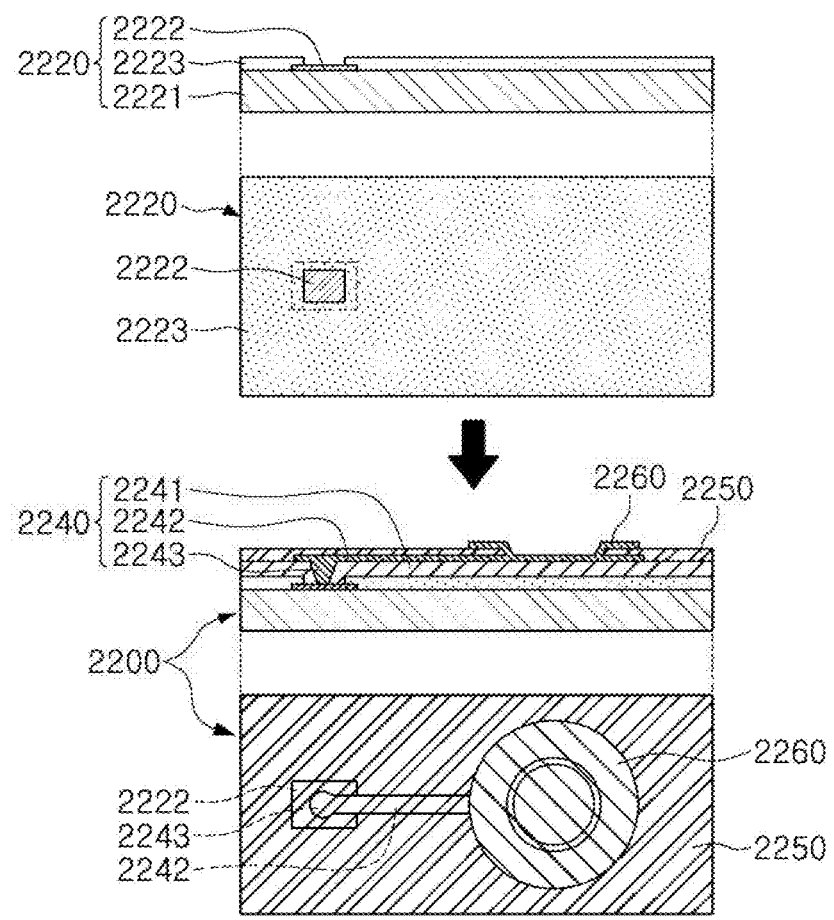
FIGS. 3A and 3B are schematic cross-sectional views illustrating states of a fan-in semiconductor package before and after being packaged.
Figure 3B:
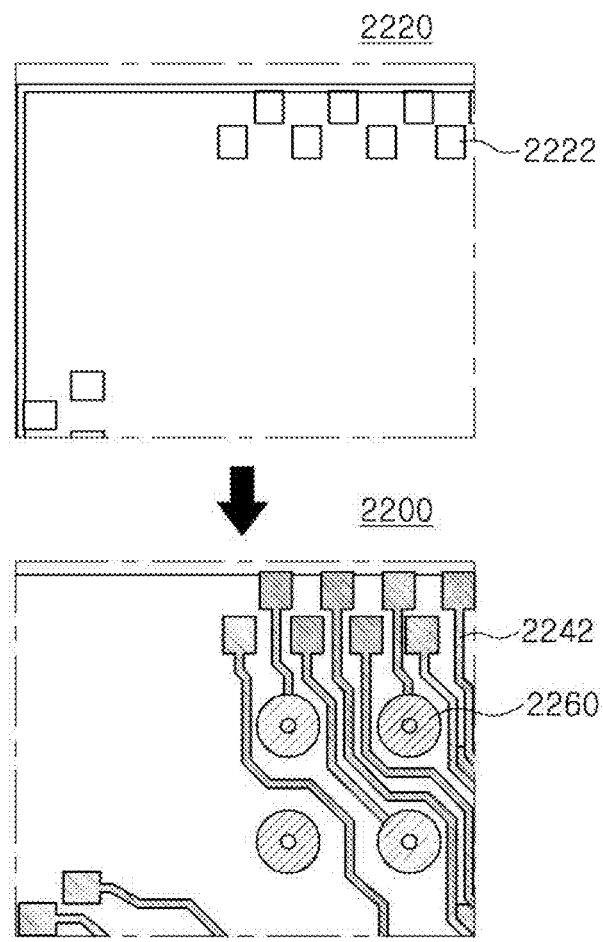

FIGS. 3A and 3B are cross-sectional views schematically illustrating a fan-in semiconductor package, before and after packaging thereof.

Figure 4:
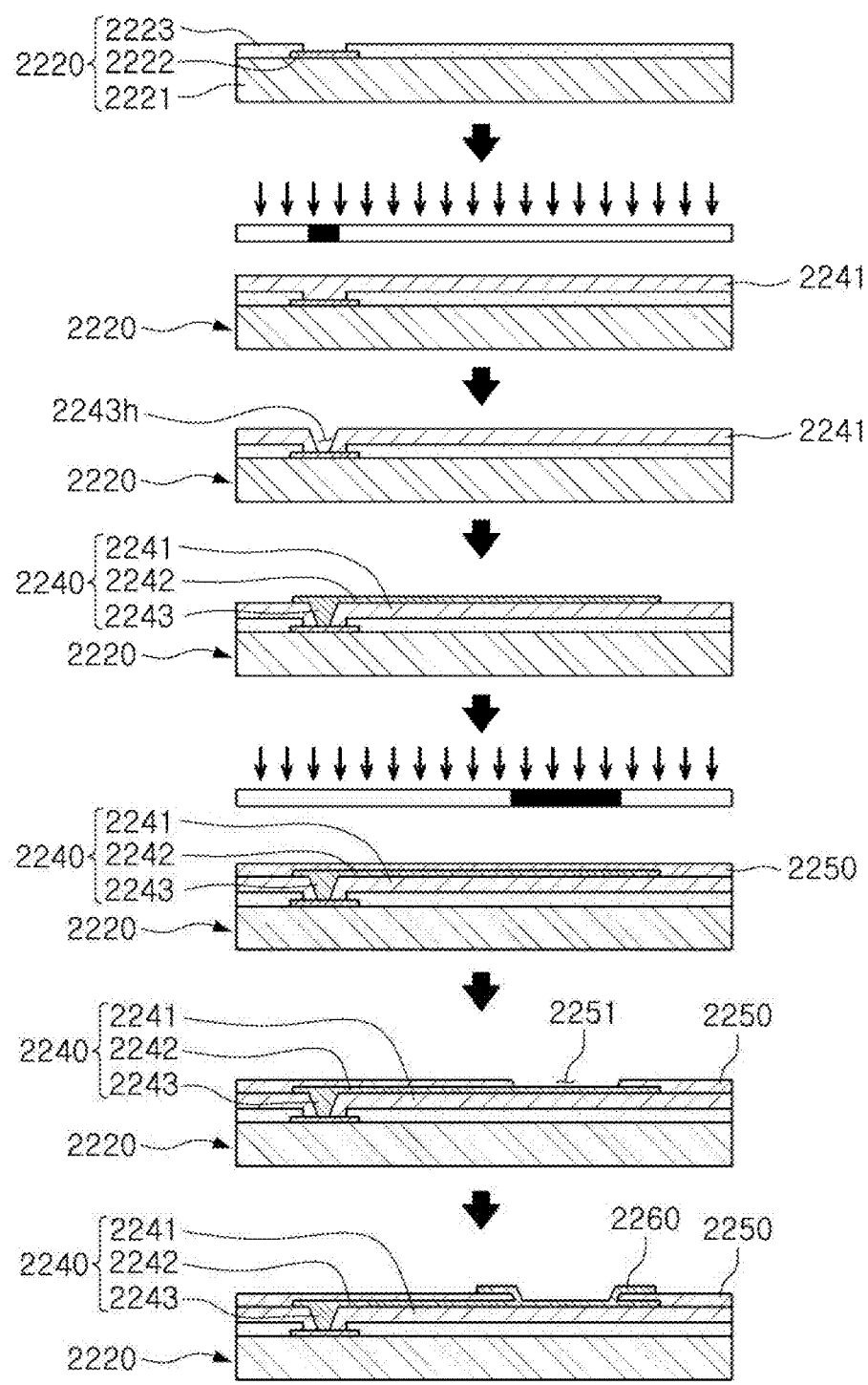
FIG. 4 is schematic cross-sectional view illustrating a packaging process of a fan-in semiconductor package.

FIG. 4 is a cross-sectional view schematically illustrating a packaging process of a fan-in semiconductor package.

Referring to the drawings, a semiconductor chip 2220 may be an integrated circuit IC in a bare state. A body 2221 may include silicon (Si), germanium (Ge), gallium arsenide (GaAs), or the like. A connection pad 2222 may include a conductive material, such as aluminum (Al) or the like, formed on one surface of the body 2221. A passivation film 2223, such as an oxide film, a nitride film, or the like, may be formed on one surface of the body 2221 and cover at least a portion of the connection pad 2222. At this time, since the connection pad 2222 is very small, it may be difficult to mount the integrated circuit IC even on a medium-level printed circuit board PCB as well as a main board of the electronic device.

A connection structure 2240 may be formed on the semiconductor chip 2220 in conformity with the size of the semiconductor chip 2220, to redistribute the connection pad 2222. The connection structure 2240 may be prepared by way of forming an insulation layer 2241 with an insulating material such as a photo-imageable dielectric resin PID on the semiconductor chip 2220, forming a via hole 2243h for opening the connection pad 2222, and forming a wiring pattern 2242 and a via 2243. Thereafter, a passivation layer 2250 for protecting the connection structure 2240 may be formed, an opening 2251 may be formed, and an under-bump metal layer 2260 or the like may be formed. For example, a fan-in semiconductor package 2200 including, for example, the semiconductor chip 2220, the connection structure 2240, the passivation layer 2250, and the under-bump metal layer 2260 may be formed through a series of processes.

As described above, the fan-in semiconductor package may be a package type in which all the connection pads of the semiconductor chip, for example, input/output (I/O) terminals are arranged inside the element. The fan-in semiconductor package may have good electrical characteristics, and may be produced at relatively low cost. Accordingly, many elements in a smartphone may be manufactured in the form of a fan-in semiconductor package. Specifically, it is being developed in a direction of achieving a small-sized form and realizing fast signal transmission at the same time.

Since, in the fan-in semiconductor package, all of the I/O terminals should be disposed inside the semiconductor chip, there may be many limitations in space. Therefore, such a structure may be difficult to apply to a semiconductor chip having a large number of I/O terminals or a semiconductor chip having a small size. In addition, due to this problem, the fan-in semiconductor package may not be directly mounted on and used in a main board of an electronic device. Even when the size and interval of the I/O terminals of the semiconductor chip are enlarged in a redistributing process, they do not have a size and an interval enough to be directly mounted on the main board of the electronic device.

Figure 5:
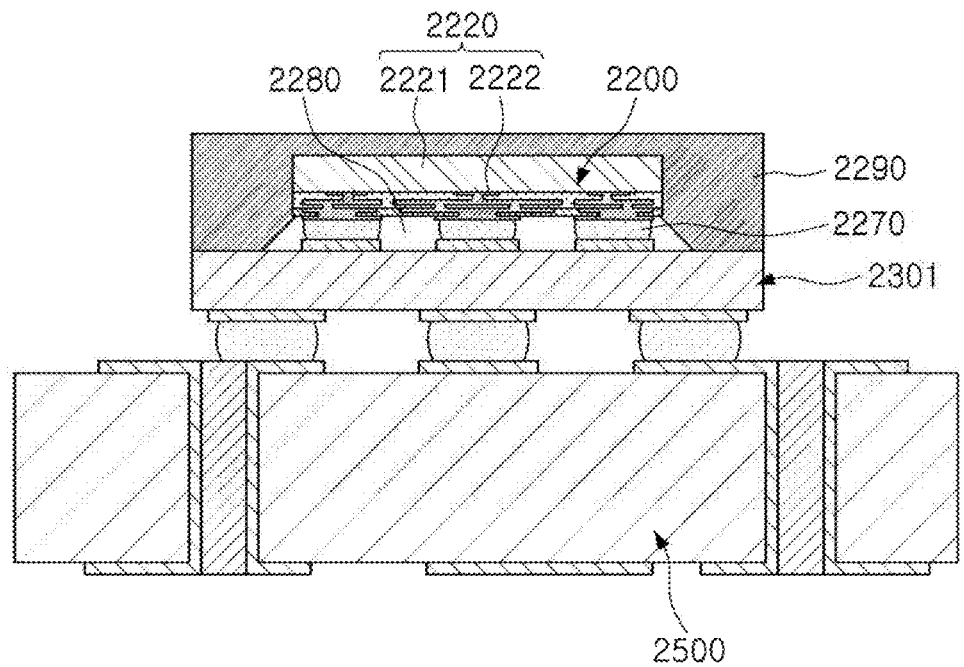
FIG. 5 is a schematic cross-sectional view illustrating a case in which a fan-in semiconductor package is mounted on a printed circuit board and is ultimately mounted on a mainboard of an electronic device.

FIG. 5 is a cross-sectional view schematically illustrating a fan-in semiconductor package mounted on a printed circuit board that is ultimately mounted on a main board of an electronic device.

Figure 6:
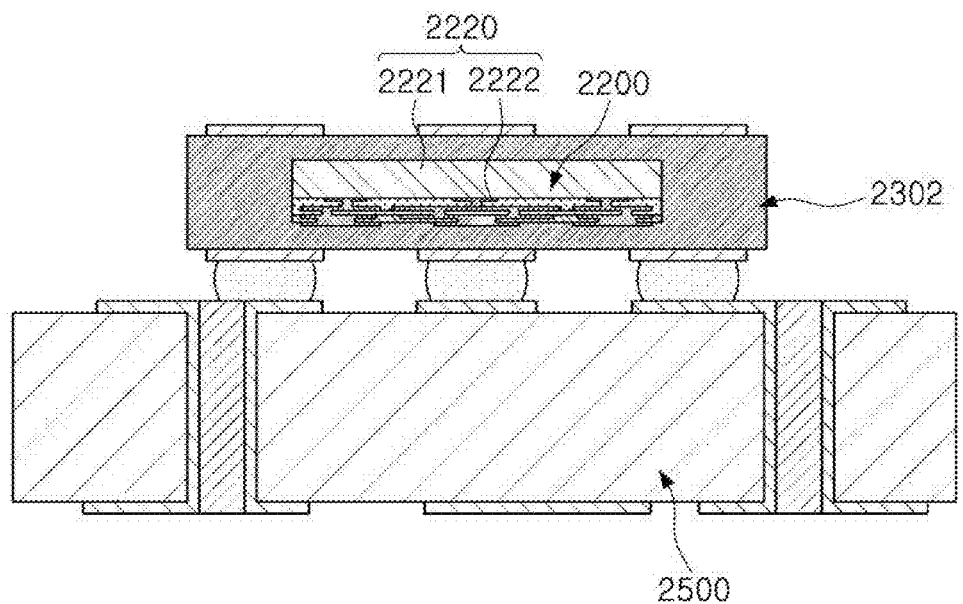
FIG. 6 is a schematic cross-sectional view illustrating a case in which a fan-in semiconductor package is embedded in a printed circuit board and is ultimately mounted on a mainboard of an electronic device.

FIG. 6 is a cross-sectional view schematically illustrating a fan-in semiconductor package embedded in a printed circuit board that is ultimately mounted on a main board of an electronic device.

Referring to the drawings, a fan-in semiconductor package 2200 may be configured such that connection pads 2222 of a semiconductor chip 2220, i.e. I/O terminals are redistributed once again through a printed circuit board 2301, and the fan-in semiconductor package 2200 mounted on the printed circuit board 2301 is mounted on a main board 2500 of an electronic device. At this time, a solder ball 2270 and the like may be fixed with an underfill resin 2280, and an outer side thereof may be covered with a molding material 2290 or the like. Alternatively, the fan-in semiconductor package 2200 may be embedded in a separate printed circuit board 2302, and the connection pads 2222 of the semiconductor chip 2220, i.e., the I/O terminals may be redistributed once again in an embedded form, and ultimately mounted on the main board 2500 of the electronic device.

As above, it may be difficult to directly mount the fan-in semiconductor package on the main board of the electronic device. Therefore, it may be mounted on a separate printed circuit board, and may be then mounted on the main board of the electronic device through a packaging process, or may be mounted on the main board of the electronic device in a form embedded in the printed circuit board.

Fan-Out Semiconductor Package

Figure 7:
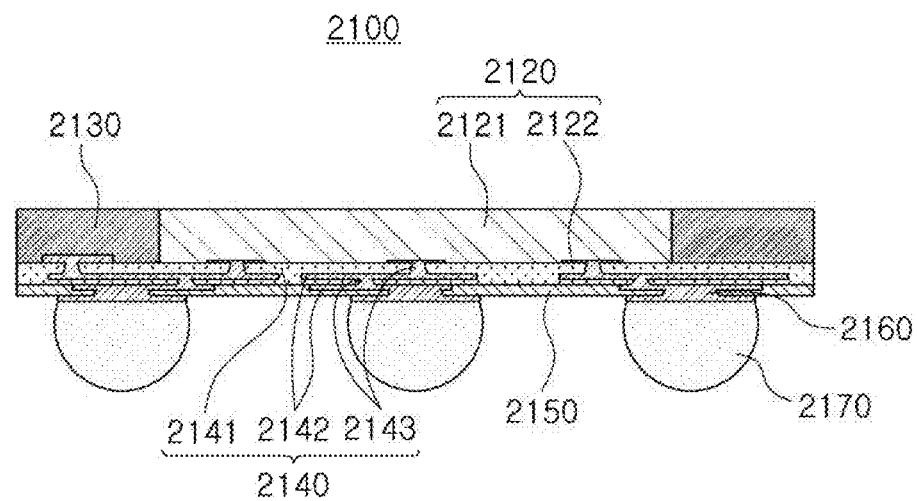
FIG. 7 is a schematic cross-sectional view illustrating a fan-out semiconductor package.

FIG. 7 is a cross-sectional view schematically illustrating a fan-out semiconductor package.

Referring to the drawings, in a fan-out semiconductor package 2100, for example, an outer side of a semiconductor chip 2120 may be protected by an encapsulant 2130, and connection pads 2122 of the semiconductor chip 2120 may be redistributed to the outer side of the semiconductor chip 2120 through a connection structure 2140. A passivation layer 2150 may be further formed on the connection structure 2140. An under-bump metal layer 2160 may be further formed on an opening of the passivation layer 2150. A solder ball 2170 may be further formed on the under-bump metal layer 2160. The semiconductor chip 2120 may be an integrated circuit IC including a body 2121, a connection pad 2122, and the like. The connection structure 2140 may include an insulation layer 2141, a wiring layer 2142 formed on the insulation layer 2241, and a via 2143 for electrically connecting the connection pad 2122 and the wiring layer 2142.

The fan-out semiconductor package may be formed by redistributing the I/O terminals to the outer side of the semiconductor chip through the connection structure formed on the semiconductor chip. As described above, in a fan-in semiconductor package, all of the I/O terminals of the semiconductor chip should be disposed inside of the semiconductor chip. When the size of the element is reduced, the size and pitch of the ball should be reduced. Therefore, the standardized ball layout may be not used. On the other hand, in a fan-out semiconductor package, the I/O terminals may be redistributed outward from the semiconductor chip through the connection structure formed on the semiconductor chip. Although the size of the semiconductor chip is reduced, the standardized ball layout may be used as it is. Therefore, the fan-out semiconductor package may be mounted on a main board of an electronic device without a separate printed circuit board, as described later.

Figure 8:
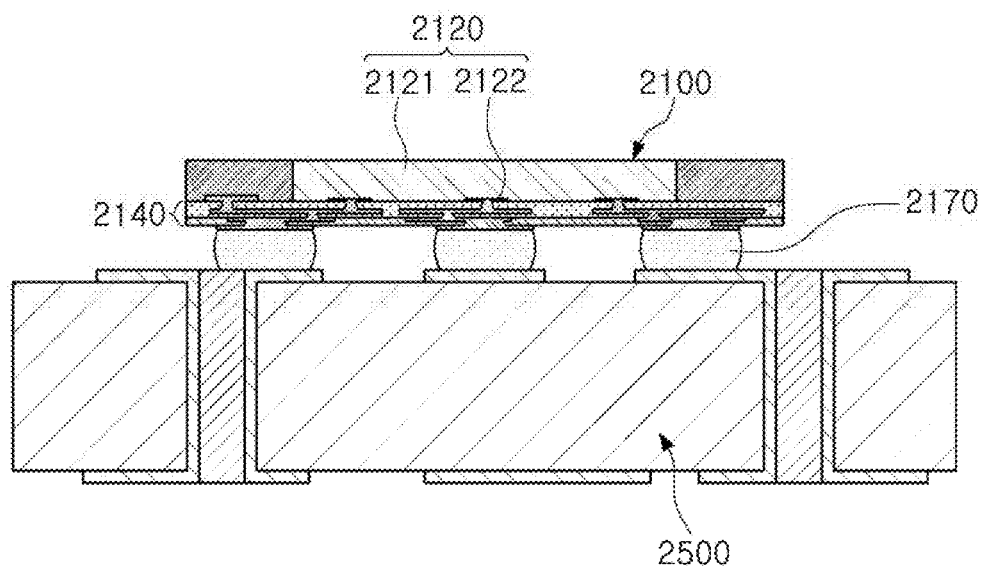
FIG. 8 is a schematic cross-sectional view illustrating a case in which a fan-out semiconductor package is mounted on a mainboard of an electronic device.

FIG. 8 is a cross-sectional view schematically illustrating a fan-out semiconductor package mounted on a main board of an electronic device.

Referring to the drawings, a fan-out semiconductor package 2100 may be mounted on a main board 2500 of an electronic device through a solder ball 2170 or the like. For example, as described above, the fan-out semiconductor package 2100 may include a connection structure 2120 on the semiconductor chip 2120 that may redistribute connection pads 2122 to a fan-out area beyond a size of the semiconductor chip 2120. The standardized ball layout may be used as it is, and as a result, it may be mounted on the main board 2500 of the electronic device without a separate printed circuit board or the like.

Since the fan-out semiconductor package may be mounted on the main board of the electronic device without a separate printed circuit board, as above, the fan-out semiconductor package may be made thinner than the fan-in semiconductor package using the printed circuit board. Therefore, a downsizing and thinning in the fan-out semiconductor package may be accomplished. It may be also suitable for mobile products because of its excellent thermal and electrical properties. In addition, it may be implemented more compactly than a general package-on-package POP type using a printed circuit board PCB, and a problem caused by a bending phenomenon may be prevented.

The fan-out semiconductor package may refer to a package technology for mounting the semiconductor chip on a main board of the electronic device, or the like, and for protecting the semiconductor chip from an external impact, and may have a concept different from a printed circuit board PCB, such as a printed circuit board in which a fan-in semiconductor package is embedded, which are different from each other in view of scale, use, and the like.

Hereinafter, a fan-out semiconductor package having a backside circuit, capable of applying to a package-on-package (POP) structure, capable of ensuring excellent signal and power characteristics, and also capable of securing weight lightening, thinning, shortening, and compactness of the product, may be described with reference to the drawings.

Figure 9:
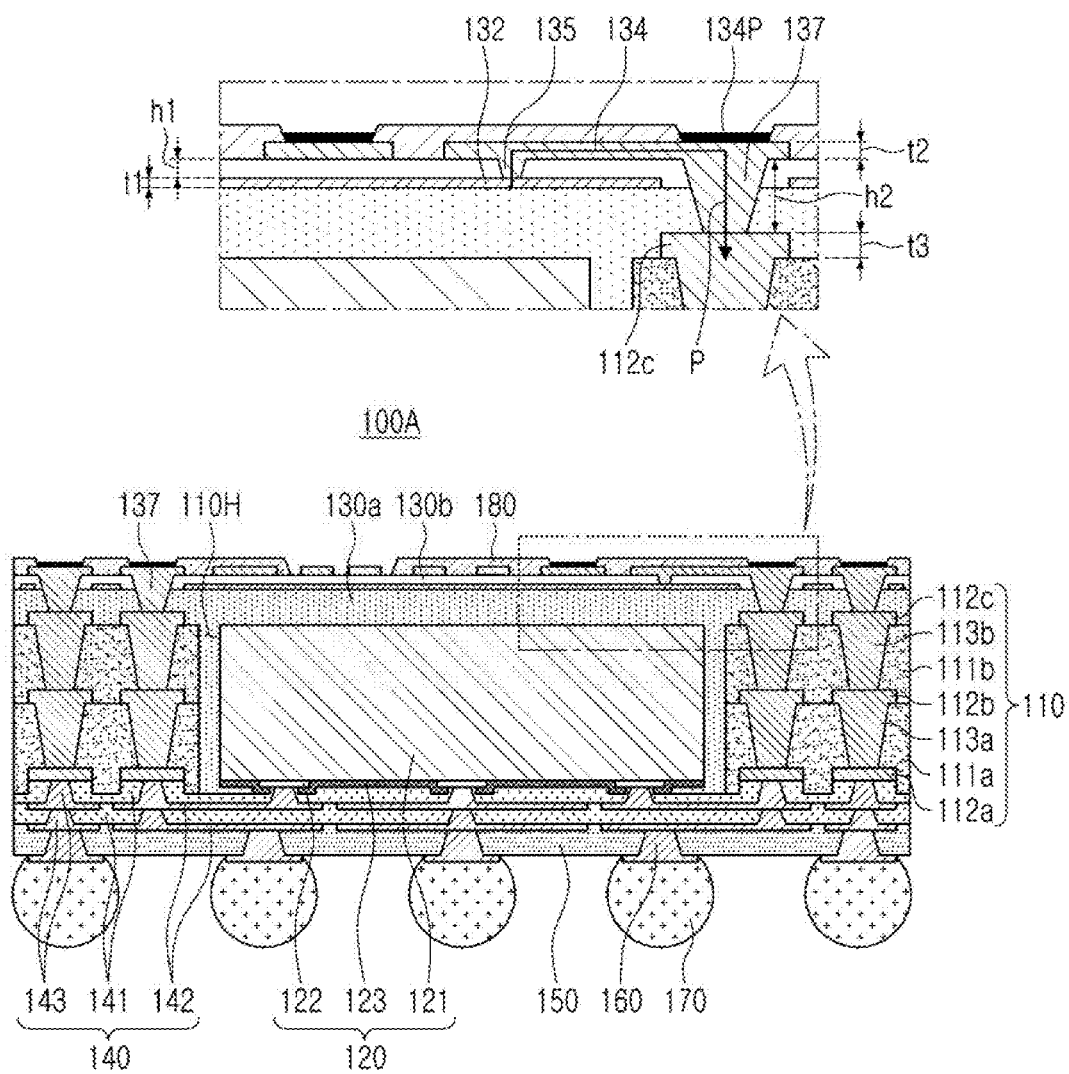
FIG. 9 is a schematic cross-sectional view illustrating an example of a fan-out semiconductor package.

FIG. 9 is a schematic cross-sectional view illustrating an example of a fan-out semiconductor package.

Referring to the drawings, a fan-out semiconductor package 100A according to an example may include a frame 110 having a through-hole 110H and including one or more wiring layers 112a, 112b, and 112c; a semiconductor chip 120 disposed in the through-hole 110H of the frame 110; a connection structure 140 disposed below each of the frame 110 and the semiconductor chip 120, and including one or more redistribution layers 142; an encapsulant 130a covering an upper surface of each of the frame 110 and the semiconductor chip 120, and filling a space between a wall surface of the through-hole 110H of the frame 110 and a side surface of the semiconductor chip 120; a first metal pattern layer 132 disposed on an upper surface of the encapsulant 130a; an insulating material 130b disposed on the upper surface of the encapsulant 130a and covering the first metal pattern layer 132; and a second metal pattern layer 134 disposed on an upper surface of the insulating material 130b. The first metal pattern layer 132 is located on a level between a lower surface of the second metal pattern layer 134 and an upper surface of an uppermost wiring layer 112c among the wiring layers 112a, 112b, and 112c of the frame 110. In this case, the first metal pattern layer 132 is electrically connected to the uppermost wiring layer 112c by a path P passing through the second metal pattern layer 134. The semiconductor package 100A according to an example may further include a first metal via 135 passing through the insulating material 130b and electrically connecting the first and second metal pattern layers 132 and 134; and a second metal via 137 passing through the encapsulant 130a and the insulating material 130b and electrically connecting the second metal pattern layer 134 and the uppermost wiring layer 112c. The path P may pass through the first metal pattern layer 132, the first metal via 135, the second metal pattern layer 134, the second metal via 137, and the uppermost wiring layer 112c in sequence, or vice versa.

As described above, in order to improve the electrical characteristics of the premium smartphone product and efficiently utilize space, and to apply a package on package (POP) of a semiconductor package including different semiconductor chips, there are the requirements for forming the backside circuit in a semiconductor package structure, and the requirements for the line and space of the backside circuit are increasing in accordance with the demand for the enhancement of the characteristics of the chip and the reduction in the area. For example, there is a demand for a package-on-package structure in which memory packages are stacked on an application processor package. For this purpose, introduction of a backside circuit of a fine design is required.

Therefore, a technique of forming a backside circuit by plating on an upper surface of a molding material for sealing a semiconductor chip has been proposed. In recent years, it has been required to secure excellent signal and power characteristics due to an increase in memory capacity and speed. When a backside circuit is formed in a single layer as described above, it may be difficult to secure excellent signal and power characteristics. In order to solve this problem, it may be considered to further stack an insulation layer on the molding material and further form a backside circuit on the stacked insulation layer. In this case, there may be problems that a via forming process may be added, and the entire thickness thereof becomes thick.

Since a fan-out semiconductor package 100A according to an embodiment basically includes the first and second metal pattern layers 132 and 134 arranged on different levels as a backside circuit, excellent signal and power characteristics may be ensured through an appropriate arrangement of a signal pattern and a ground pattern. For example, the first metal pattern layer 132 formed on the upper surface of the encapsulant 130a is connected to the uppermost wiring layer 112c of the frame 110 not directly through a via penetrating only the encapsulant 130a, but may be electrically connected thereto by the path P passing through the second metal pattern layer 134, for example, by the path P passing through the first metal via 135, the first metal pattern layer 134, and the second metal via 137. In this case, there is no separate metal via connecting between the first metal pattern layer 132 and the uppermost wiring layer 112c of the frame 110, such that the via process may be omitted once. Thus, the first metal pattern layer 134 may be spaced apart from a via such as the second metal via 137 penetrating into the encapsulant 130a. Since a via plating process is unnecessary, a plated thickness of the first metal pattern layer 132 may be reduced, and as a result, the overall thickness of the package 100A may also be lowered.

A thickness t1 of the first metal pattern layer 132 may be thinner than a thickness t2 of the second metal pattern layer 134 and/or a thickness t3 of the uppermost wiring layer 112c of the frame 110. In addition, the thickness t2 of the second metal pattern layer 134 may also be thinner than the thickness t3 of the uppermost wiring layer 112c of the frame 110 for further thinning. In addition, a height h1 of the first metal via 135 may be less than a height h2 of the second metal via 137. Therefore, the entire thickness of the package 100A may be minimized.

The first metal pattern layer 132 may include a ground pattern, but may not include a signal pattern. The second metal pattern layer 134 may include both a ground pattern and a signal pattern. For example, the first metal pattern layer 132 may be designed mainly for a ground pattern to provide a more wider ground plane, and the second metal pattern layer 134 may be designed mainly for a signal pattern to provide a much shorter signal path, thereby both of signal and power characteristics may be improved. In this case, the ground pattern of the first metal pattern layer 132 may be electrically connected to the ground pattern of the uppermost wiring layer 112c by a route passing through ground vias of the first metal via 135, ground patterns of the second metal pattern layer 134, and ground vias of the second metal via 137 in sequence, or vice versa. Further, the signal pattern of the second metal pattern layer 134 may be electrically connected to the signal pattern of the uppermost wiring layer 112c through the signal via of the second metal via 137 in the shortest path. In addition, warpage control may be performed in an upper portion of the package 100A through the first metal pattern layer 132.

From this point of view, a planar area of the first metal pattern layer 132 covering the upper surface of the encapsulant 130a may be larger than a planar area of the second metal pattern layer 134 covering the upper surface of the insulating material 130b. This is because the first metal pattern layer 132 is designed mainly for the ground pattern, and the second metal pattern layer 134 is designed mainly for the signal pattern. A metal ratio of the first metal pattern layer 132 may be larger than a metal ratio of the second metal pattern layer 134, in a region directly above the inactive surface of the semiconductor chip 120.

A fan-out semiconductor package 100A according to an example may further include a first passivation layer 150 disposed below the connection structure 140, and having a plurality of first openings for respectively opening at least a portion of a lowermost redistribution layer 142 among the redistribution layers 142; a plurality of under-bump metals 160 respectively disposed on the plurality of first openings and electrically connected to the lowermost redistribution layer 142, respectively; a plurality of electrical connection metals 170 disposed below the first passivation layer 150 and electrically connected to the plurality of under-bump metals 160, respectively; and/or a second passivation layer 180 disposed on the upper surface of the insulating material 130b, covering the second metal pattern layer 134, and having a plurality of second openings respectively opening at least a portion of the second metal pattern layer 134.

Hereinafter, each configuration included in a fan-out semiconductor package 100A according to an example will be described in more detail.

The frame 110 may improve the rigidity of the package 100A according to a specific material of the insulation layers 111a and 111b, and may play a role of ensuring thickness uniformity of the encapsulant 130a. The frame 110 may have the through-hole 110H passing through the insulation layers 111a and 111b. The semiconductor chip 120 may be disposed in the through-hole 110H, and passive components (not illustrated) may be disposed together as necessary. The through-hole 110H may have a wall surface surrounding the semiconductor chip 120, but not limited thereto. The frame 110 may include the wiring layers 112a, 112b, and 112c and the wiring vias 113a and 113b, in addition to the insulation layers 111a and 111b, and thus may function as an electrical connection member for providing a vertical electrical connection path. As necessary, the electrical connection member capable of providing another type of vertical electrical connection path such as a metal post, instead of the frame 110, may be introduced.

The frame 110 may include a first insulation layer 111a contacting the connection structure 140; a first wiring layer 112a contacting the connection structure 140 and embedded in the first insulation layer 111a; a second wiring layer 112b disposed on aside of the first insulation layer 111a, opposite to a side in which the first wiring layer 112a is embedded; a second insulation layer 111b disposed on the first insulation layer 111a and covering the second wiring layer 112b; and a third wiring layer 112c disposed on a side of the second insulation layer 111b, opposite to a side in which the second wiring layer 112b is embedded. The first and second wiring layers 112a and 112b and the second and third wiring layers 112b and 112c may be electrically connected to each other through the first and second wiring vias 113a and 113b passing through the first and second insulation layers 111a and 111b. The first to third wiring layers 112a to 112c may be electrically connected to the connection pad 122 through the redistribution layer 142 and the connection via 143, in accordance with functions thereof.

Materials of the insulation layers 111a and 111b are not particularly limited. For example, an insulating material may be used. As the insulating material, a thermosetting resin such as an epoxy resin, a thermoplastic resin such as polyimide, or a resin in which these resins are mixed with an inorganic filler, for example, ABF (Ajinomoto Build-up Film), or the like, may be used. Alternatively, a material impregnated with the above-mentioned resin, for example, a prepreg, or the like may be used for a core material such as glass fiber, glass cloth, glass fabric, or the like, together with an inorganic filler.

The wiring layers 112a, 112b, and 112c together with the wiring vias 113a and 113b may provide a vertical electrical connection path for the package and may perform the role of redistributing the connection pad 122. As a material for forming the wiring layers 112a, 112b, and 112c, a metal material such as copper (Cu), aluminum (Al), silver (Ag), tin (Sn), gold (Au), nickel (Ni), lead (Pb), titanium (Ti), or alloys thereof may be used. The wiring layers 112a, 112b, and 112c may perform various functions, depending on a desired design of the layer. For example, a ground (GND) pattern, a power (PWR) pattern, a signal (S) pattern, and the like, may be included. Here, the signal (S) pattern may include various signals except for a ground (GND) pattern, a power (PWR) pattern, and the like, for example, a data signal and the like. The ground (GND) pattern and the power (PWR) pattern may be the same pattern. The wiring layers 112a, 112b, and 112c may include various types of via pads and the like. The wiring layers 112a, 112b, and 112c may be formed by a known plating process, and may be composed of a seed layer and a conductor layer, respectively.

A thickness of each of the wiring layers 112a, 112b, and 112c may be thicker than a thickness of each of the redistribution layers 142. For example, the frame 110 may have a thickness equal to or greater than a thickness of the semiconductor chip 120. In order to maintain rigidity, prepregs and the like may be selected as the material of the insulation layers 111a and 111b, and wiring layers 112a, 112b, and 112c may be relatively thick. The connection structure 140 may require a microcircuit and a high-density design. Therefore, a photo-imageable dielectric resin (PID), or the like, may be selected as the material of the insulation layer 141, and a thickness of the redistribution layer 142 obtained therefrom may be relatively thin. The thickness of each of the wiring layers 112a, 112b, and 112c may be thicker than the thicknesses t1 and t2 of the first and second metal pattern layers 132 and 134, respectively. In particular, the thickness of each of the wiring layers 112a, 112b, and 112 may be thicker than the thickness t1 of the first metal pattern layer 132. The description thereof is as described above.

The first wiring layer 112a may be recessed into the first insulation layer 111a. In this way, in a case which the first wiring layer 112a is recessed into the first insulation layer 111a to have a step difference between a surface of the first insulation layer 111a in contact with the connection structure 140 and a surface of the first wiring layer 112a in contact with the connection structure 140, when the semiconductor chip 120 and the frame 110 are encapsulated with the encapsulant 130a, the forming material may be prevented from being bleeding to contaminate the first wiring layer 112a.

The wiring vias 113a and 113b may electrically connect the wiring layers 112a, 112b, and 112c formed on different layers, thereby forming an electrical path in the frame 110. As the material for forming the wiring vias 113a and 113b, a metal material, such as copper (Cu), aluminum (Al), silver (Ag), tin (Sn), gold (Au), nickel (Ni), lead (Pb), titanium (Ti), or alloys thereof may be used. The wiring vias 113a and 113b may include a signal via, a power via, a ground via, etc. The power via and ground via may be the same via. The wiring vias 113a and 113b may also be a field type via filled with a metal material, respectively, or a metal material may be a conformal type via formed along a wall surface of a via hole. Further, they may each have a tapered shape. The wiring vias 113a and 113b may be also be formed by a plating process, and may be composed of a seed layer and a conductor layer.

A portion of the pads of the first wiring layer 112a may serve as a stopper, when a hole for the first wiring via 113a is formed. The width of the upper surface of the first wiring via 113a having a tapered shape may be wider than the width of the lower surface thereof in terms of the process. In this case, the first wiring via 113a may be integrated with the pad pattern of the second wiring layer 112b. When a hole for the second wiring via 113b is formed, a portion of the pads of the second wiring layer 112b may serve as stoppers. The width of the upper surface of the second wiring via 113b having a tapered shape may be wider than the width of the lower surface thereof in terms of the process. In this case, the second wiring via 113b may be integrated with the pad pattern of the third wiring layer 112c.

Although not illustrated in the drawing, a metal layer (not illustrated) may be disposed on a wall surface of the through-hole 110H of the frame 110 for the purpose of shielding electromagnetic waves or for dissipating heat as required, the metal layer (not illustrated) may surround the chip 120.

The semiconductor chip 120 may be an integrated circuit (IC) in which hundreds to millions of devices are integrated into one chip. In this case, the integrated circuit may be an application processor chip, such as a central processor (e.g., CPU), a graphics processor (e.g., GPU), a digital signal processor, a cryptographic processor, a microprocessor, and the like, but is not limited thereto; may be a power management IC (PMIC), or may be a memory chip such as a volatile memory (for example, a dynamic random access memory (DRAM)), anon-volatile memory (for example, a read only memory (ROM)), a flash memory, or the like; an analog-to-digital converter, a logic chip such as an application-specific IC (ASIC), or the like.

The semiconductor chip 120 may be an integrated circuit in a bare state in which no separate bump or wiring layer is formed, but is not limited thereto, and may be a packaged type integrated circuit, as needed. The integrated circuit may be formed based on an active wafer. In this case, silicon (Si), germanium (Ge), gallium arsenide (GaAs), or the like may be used as a base material of a body 121 of the semiconductor chip 120. Various circuits may be formed in the body 121. The connection pad 122 may be used to electrically connect the semiconductor chip 120 to other components, and a conductive material such as aluminum (Al), and the like, may be used as a formation material thereof without any particular limitation. A passivation film 123 exposing the connection pad 122 may be formed on the body 121. The passivation film 123 may be an oxide film or a nitride film, or may be a double layer of an oxide film and a nitride film. An insulating film (not illustrated) or the like may be further disposed in other necessary positions. Meanwhile, in the semiconductor chip 120, a surface on which the connection pad 122 is disposed may become an active surface, and a surface opposite thereto may become an inactive surface. At this time, when the passivation film 123 is formed on the active surface of the semiconductor chip 120, the active surface of the semiconductor chip 120 may determine a positional relationship based on the lowermost surface of the passivation film 123.

The encapsulant 130a may encapsulate the frame 110 and the semiconductor chip 120, and may also fill at least a portion of the through-hole 110H. The encapsulant 130a may include an insulating material. Examples of the insulating material may include a resin including an inorganic filler and an insulating resin such as a thermosetting resin such as an epoxy resin, a thermoplastic resin such as polyimide, or a resin including the above materials with a reinforcing material such as an inorganic filler, specifically ABF, FR-4, BT, resin, etc. In addition, a known molding material such as EMC may be used. Further, a photosensitive material, for example, a photo imageable encapsulant (PIE) may be used as needed. An insulating resin such as a thermosetting resin or a thermoplastic resin may also use a material impregnated with a core material such as an inorganic filler and/or glass fiber, glass cloth, glass fabric, or the like, as necessary.

The first metal pattern layer 132 may be disposed on the encapsulant 130a to provide a backside circuit to the package 100A. The first metal pattern layer 132 may also include conductive materials, such as copper (Cu), aluminum (Al), silver (Ag), tin (Sn), gold (Au), nickel (Ni), lead (Pb), titanium (Ti), or alloys thereof. The first metal pattern layer 132 may perform various functions, depending on a desired design, but may preferably include only a ground (GND) pattern. The ground (GND) pattern may also function as a power (PWR) pattern. The first metal pattern layer 132 may be in the form of a plate, and thus may not include a separate pad pattern. This plate may have a plurality of islands formed by the second metal via 137. The first metal pattern layer 132 may be formed by a known plating process, and may include a seed layer and a conductor layer.

The insulating material 130b may further provide an insulation layer on the backside side of the package 100A. The insulating material 130b also may include an insulating material. Examples of the insulating material may include a resin including an inorganic filler and an insulating resin such as a thermosetting resin such as an epoxy resin, a thermoplastic resin such as polyimide, or a resin including the above materials with a reinforcing material such as an inorganic filler, specifically ABF, FR-4, BT, resin, etc. Further, a photosensitive material, for example, a photo-imageable dielectric material (PID) may be used as needed. An insulating resin such as a thermosetting resin or a thermoplastic resin may use a material impregnated with a core material such as an inorganic filler and/or glass fiber, glass cloth, glass fabric, or the like, as needed. The insulating material 130b may be formed of the same material as the encapsulant 130a, or may be formed of another material. Depending on the process, the boundary between them may be unclear.

The second metal pattern layer 134 may be disposed on the insulating material 130b to provide a backside circuit for the package 100A as well. The second metal pattern layer 134 may also include conductive materials, such as copper (Cu), aluminum (Al), silver (Ag), tin (Sn), gold (Au), nickel (Ni), lead (Pb), titanium (Ti), or alloys thereof. The second metal pattern layer 134 may perform various functions, depending on a desired design, but may preferably include only a ground (GND) pattern. The ground (GND) pattern may also function as a power (PWR) pattern. The second metal pattern layer 134 may include various types of via pads, electrical connection metal pads, and the like. The second metal pattern layer 134 may be formed by a known plating process, and may include a seed layer and a conductor layer.

The first metal via 135 may pass through the insulating material 130b, and may electrically connect the first and second metal pattern layers 132 and 134 to each other. The first metal via 135 may also include a metal material, such as copper (Cu), aluminum (Al), silver (Ag), tin (Sn), gold (Au), nickel (Ni), lead (Pb), titanium (Ti), or alloys thereof. The first metal via 135 may also be a field type via filled with a metal material, respectively, or a metal material may be a conformal type via formed along a wall surface of a via hole. Further, it may have a tapered shape in the same direction as the wiring vias 113a and 113b. The first metal via 135 may also include signal vias, ground vias, power vias, etc. The power vias and ground vias may be the same vias. The first metal via 135 may be formed by a known plating process, and may include a seed layer and a conductor layer.

The second metal via 137 may pass through the encapsulant 130a and the insulating material 130b, and may electrically connect the second metal pattern layer 134 and the uppermost wiring layer 112c of the frame 110. The second metal via 137 may also include a metal material, such as copper (Cu), aluminum (Al), silver (Ag), tin (Sn), gold (Au), nickel (Ni), lead (Pb), titanium (Ti), or alloys thereof. The second metal via 137 may also be a field type via filled with a metal material, respectively, or a metal material may be a conformal type via formed along a wall surface of a via hole. Further, it may have a tapered shape in the same direction as the wiring vias 113a and 113b. The second metal via 137 may also include signal vias, ground vias, power vias, etc. The power vias and ground vias may be the same vias. The second metal via 137 may be formed by a known plating process, and may include a seed layer and a conductor layer.

The connection structure 140 may redistribute the connection pad 122 of the semiconductor chip 120. The connection pads 122 of several tens to hundreds of semiconductor chips 120 having various functions may be redistributed through the connection structure 140. The connection pads 122 may be physically and/or may be electrically connected externally, in accordance with functions thereof, through the electrical connection metal 170. The connection structure 140 may include an insulation layer 141, a redistribution layer 142 disposed on the insulation layer 141, and a connection via 143 passing through the insulation layer 141, and electrically connecting the connecting pad 122 and the redistribution layer 142, and the lowermost wiring layer 112a among the wiring layers 112a, 112b, and 112c and the redistribution layer 142. These may be more or less than those illustrated in the drawings.

As the material of the insulation layer 141, an insulating material may be used. In this case, a photo-imageable dielectric material (PID) may be used as an insulating material. In this case, a fine pitch may be introduced through the photo-via process. Tens to millions of the connection pads 122 in the semiconductor chip 120 may be redistributed very effectively as in the conventional case. The insulation layer 141 may be bounded to each other, and the boundaries may be unclear.

The redistribution layer 142 may be redistributed to electrically connect the connection pad 122 of the semiconductor chip 120 to the electrical connection metal 170. As a material for forming the redistribution layer 142, a metal material such as copper (Cu), aluminum (Al), silver (Ag), tin (Sn), gold (Au), nickel (Ni), lead (Pb), titanium (Ti), or alloys thereof may be used. The redistribution layer 142 may also perform various functions, depending on a desired design. For example, a ground (GND) pattern, a power (PWR) pattern, a signal (S) pattern, and the like, may be included. The ground (GND) pattern and the power (PWR) pattern may be the same pattern. In addition, the redistribution layer 142 may include various types of via pads, electrical connection metal pads, and the like. The redistribution layer 142 may be formed by a plating process, and may include a seed layer and a conductor layer.

The connection via 143 may electrically connect the redistribution layer 142 formed on different layers, and may electrically connect the connection pad 122 of the semiconductor chip 120 and the lowermost wiring layer 112a of the frame 110 to the redistribution layer 142. The connection via 143 may be in physical contact with the connection pad 122, when the semiconductor chip 120 is a bare die. As the material for forming the connection via 143, a metal material, such as copper (Cu), aluminum (Al), silver (Ag), tin (Sn), gold (Au), nickel (Ni), lead (Pb), titanium (Ti), or alloys thereof may be used. The connection via 143 may include a signal via, a power via, a ground via, etc. The power via and ground via may be the same via. The connection via 143 may also be a field type via filled with a metal material, respectively, or a metal material may be a conformal type via formed along a wall surface of a via hole. Further, the connection via 143 and each of the wiring vias 113a and 113b may have a shape tapered in opposite directions. The connection via 143 may also be formed using a plating process, and may be composed of a seed layer and a conductor layer.

The first passivation layer 150 may be an additional structure for protecting the connection structure 140 from external physical or chemical damage, or the like. The first passivation layer 150 may include a thermosetting resin. For example, the first passivation layer 150 may be ABF, but is not limited thereto. The first passivation layer 150 may have openings for opening at least a portion of the lowermost redistribution layer 142 among the redistribution layers 142. The number of openings may be in the range of tens to tens of thousands, or more or less. Each of the openings may be formed of a plurality of holes. As necessary, a surface mounting component such as a capacitor may be disposed on the lower surface of the first passivation layer 150 to be electrically connected to the redistribution layer 142, and as a result, may be electrically connected to the semiconductor chip 120.

The under-bump metal 160 may also be an additional component, which improves the connection reliability of the electrical connection metal 170, and thus improve the board level reliability of a fan-out semiconductor package 100A according to one example. The under-bump metal 160 may be provided as the number of tens to tens of thousands, and may be provided as the number more or less than that numbers. Each under-bump metal 160 may be electrically connected to the open lowermost redistribution layer 142 formed at the opening of the first passivation layer 150. The under-bump metal 160 may be formed by a known metallization method using a known conductive material, for example, metal, but is not limited thereto.

The electrical connection metal 170 may also be an additional component, a configuration for physically and/or electrically connecting a semiconductor package 100A externally. For example, the semiconductor package 100A may be mounted on the main board of the electronic device through the electrical connection metal 170. The electrical connection metal 170 may be disposed on the first passivation layer 150, and may be electrically connected to the under-bump metal 160, respectively. The electrical connection metal 170 may be composed of a low melting point metal, for example, tin (Sn), or an alloy including tin (Sn). More specifically, it may be formed of a solder or the like, but this may be merely an example embodiment, and the material is not particularly limited thereto.

The electrical connection metal 170 may be a land, a ball, a pin, or the like. The electrical connection metal 170 may be formed of multiple layers or a single layer. In a case of being formed of multiple layers, it may include a copper pillar and a solder. In a case of being formed of a single layer, tin-silver solder or copper may be included, but this may be merely an example and is not limited thereto. The number, interval, arrangement type, etc., of the electrical connection metal 170 are not particularly limited, and may be sufficiently modified, depending on a design specification by a skilled artisan. For example, the number of electrical connection metal 170 may be in the range of tens to thousands, depending on the number of connection pads 122, and may be more or less than the above range.

At least one of the electrical connection metal 170 may be disposed in a fan-out area. The fan-out area may be an area, except for those in which the semiconductor chip 120 is disposed. The fan-out package may be more reliable than the fan-in package, may have many I/O terminals, and may facilitate 3D interconnection. In addition, a package thinner than a ball grid array BGA package, a land grid array (LGA) package, and the like, may be manufactured, and may be excellent in price competitiveness.

The second passivation layer 180 may be an additional structure for protecting the second metal pattern layer 134 from external physical or chemical damage, or the like. The second passivation layer 180 may include a thermosetting resin. For example, the second passivation layer 180 may also be ABF, but is not limited thereto. The second passivation layer 180 may have openings for opening at least a portion of the second metal pattern layer 134. The number of openings may be in the range of tens to tens of thousands, or more or less. A surface treatment layer 134P may be formed on a surface of the second metal pattern layer 134 opened by the opening, and the surface treatment layer 134P may be a known plated layer including nickel (Ni)/gold (Au), noble metal, and the like. As necessary, a surface mounting component such as a capacitor may be disposed on the upper surface of the second passivation layer 180 to be electrically connected to the second metal pattern layer 134, and as a result, may be electrically connected to the semiconductor chip 120.

FIGS. 10 to 13 are schematic views illustrating an example manufacturing procedure of the fan-out semiconductor package of FIG. 9.

Figure 10:
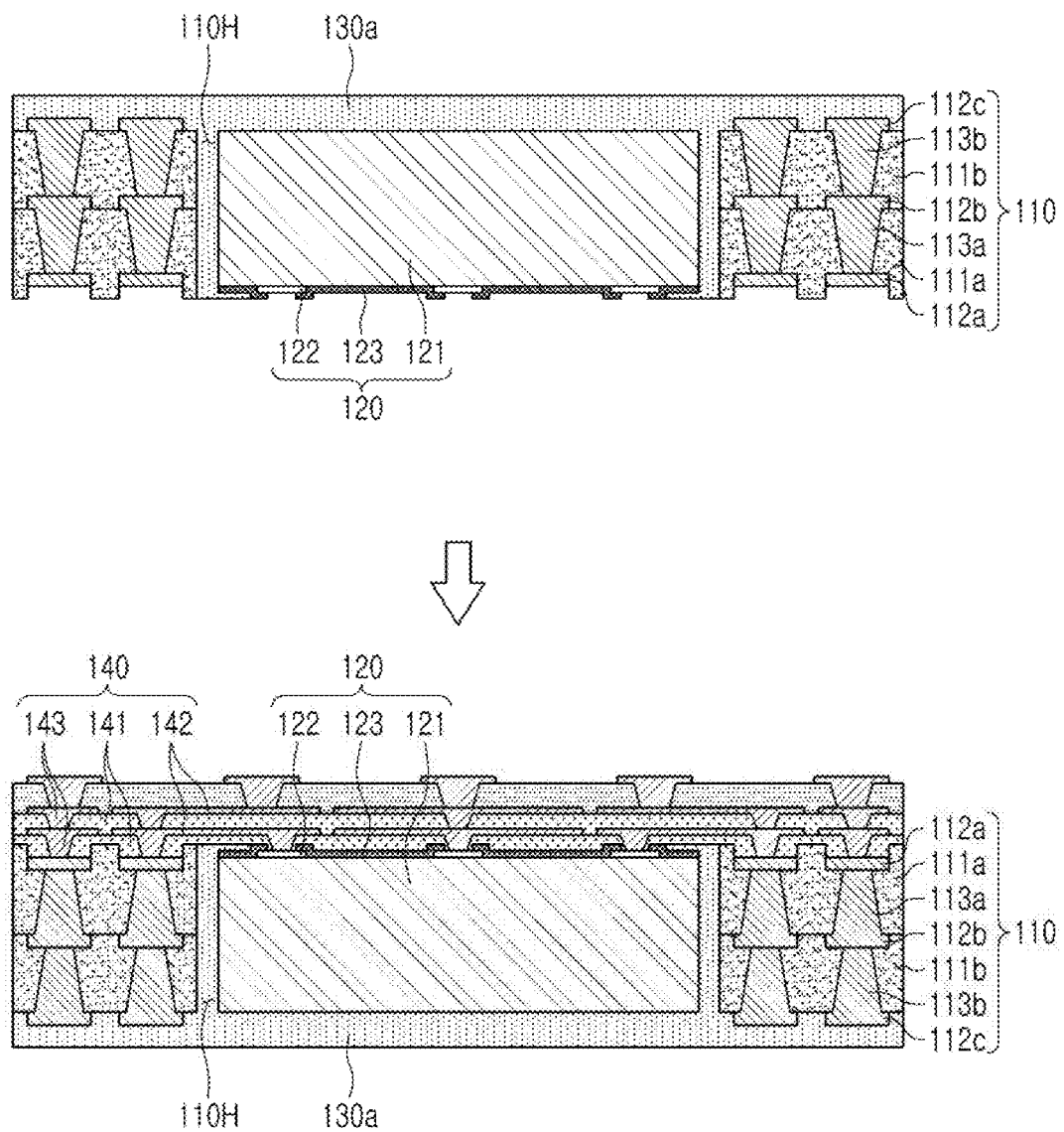
FIGS. 10 to 13 are schematic views illustrating an example manufacturing procedure of the fan-out semiconductor package of FIG. 9.

Referring to FIG. 10, a frame 110 having a through-hole 110H and including a plurality of wiring layers 112*a*, 112*b*, and 112*c* and a plurality of wiring vias 113*a* and 113*b* may be formed using a coreless substrate as a carrier. A semiconductor chip 120 including a body 121, a connection pad 122, a passivation film 123, and the like, may be disposed in the through-hole 110H in a face-down manner using a tape (not illustrated). An encapsulant 130*a* may be formed using ABF or the like. The tape (not illustrated) may be then removed. Next, a connection structure 140 may be formed in a region from which a tape (not illustrated) is removed. The connection structure 140 may be formed by forming an insulation layer 141 using a PID or the like, forming a via hole by a photolithography process, and then forming a redistribution layer 142 and a connection via 143 by a plating process. As a plating process used, an additive process (AP), a semi-AP (SAP) process, a modified SAP (MSAP) process, a tenting process, and the like, may be used.

Figure 11:
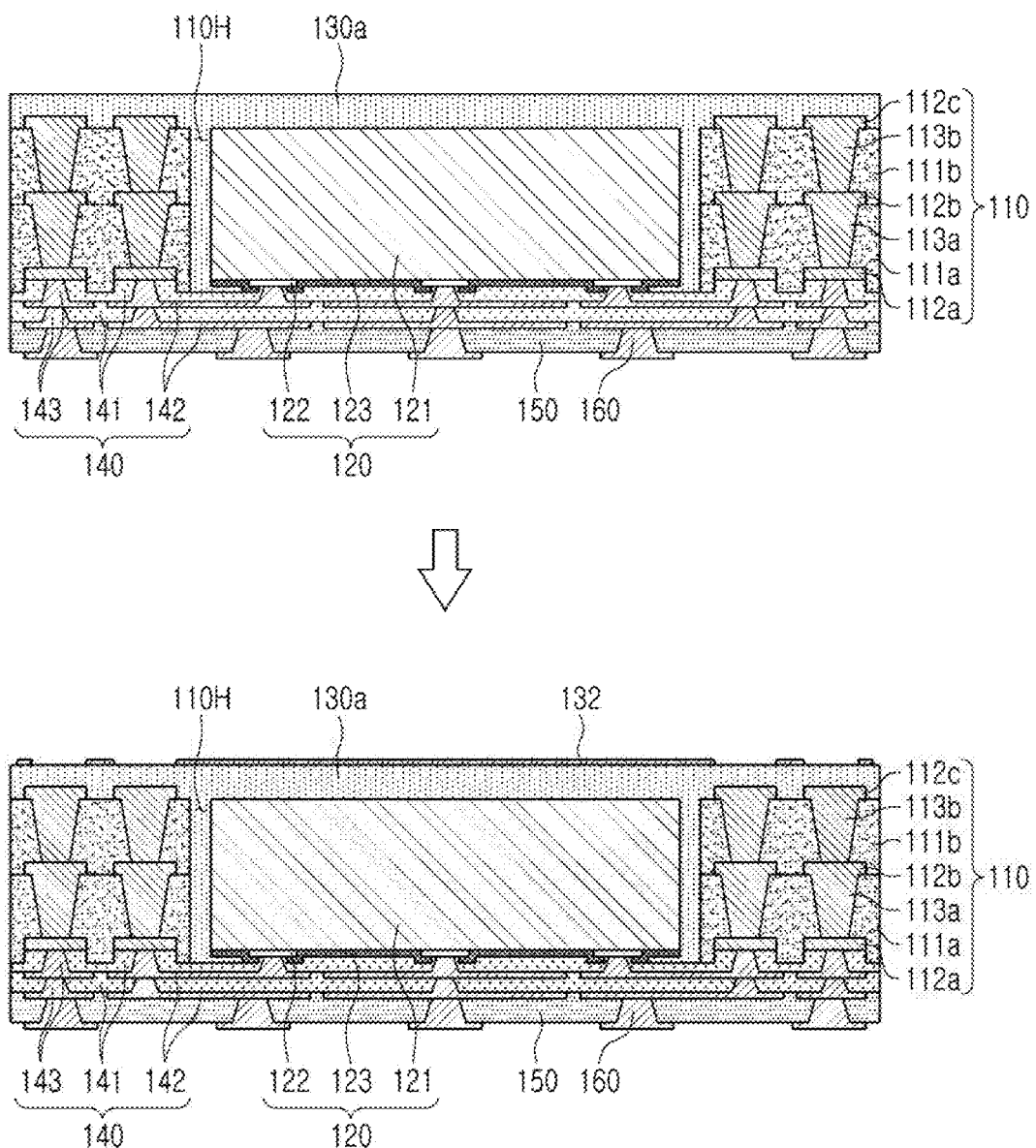

Referring to FIG. 11, a first passivation layer 150 may be formed using ABF or the like, as needed. Further, an opening may be formed in the first passivation layer 150, and then the opening may be filled using the above-described plating process to form a plurality of under-bump metals 160. Next, a first metal pattern layer 132 may be formed on the encapsulant 130*a* by the above-described plating process.

Figure 12:
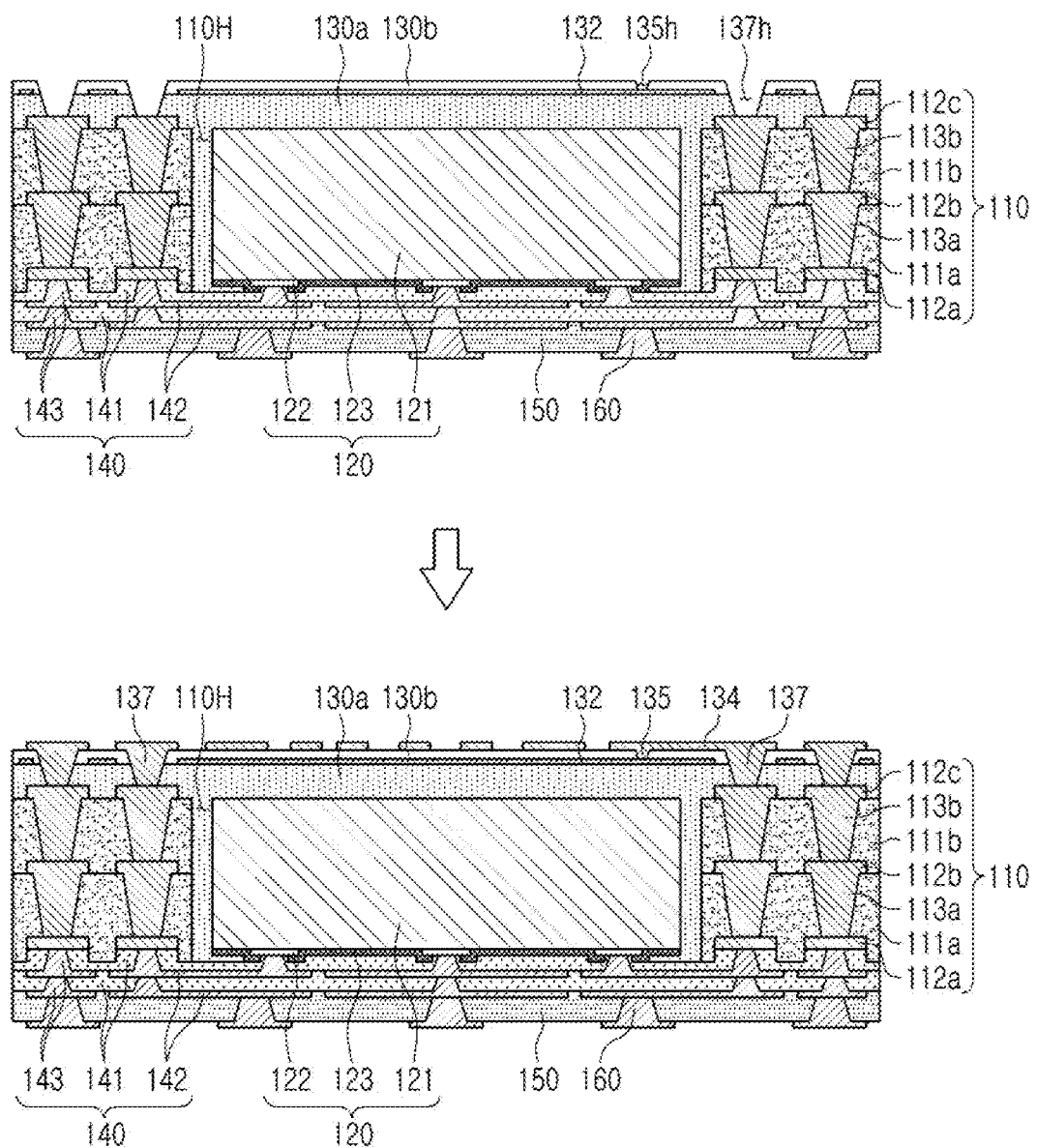

Referring to FIG. 12, an insulating material 130*b* may be formed on the encapsulant 130*a* using ABF or the like, and via holes 135*h* and 137*h* may be formed using a laser drill and/or a mechanical drill, or the like. Next, a second metal pattern layer 134 may be formed on the insulating material 130*b* by the above-described plating process, and first and second metal vias 135 and 137 may be formed by filling the via holes 135*h* and 137*h* together.

Figure 13:
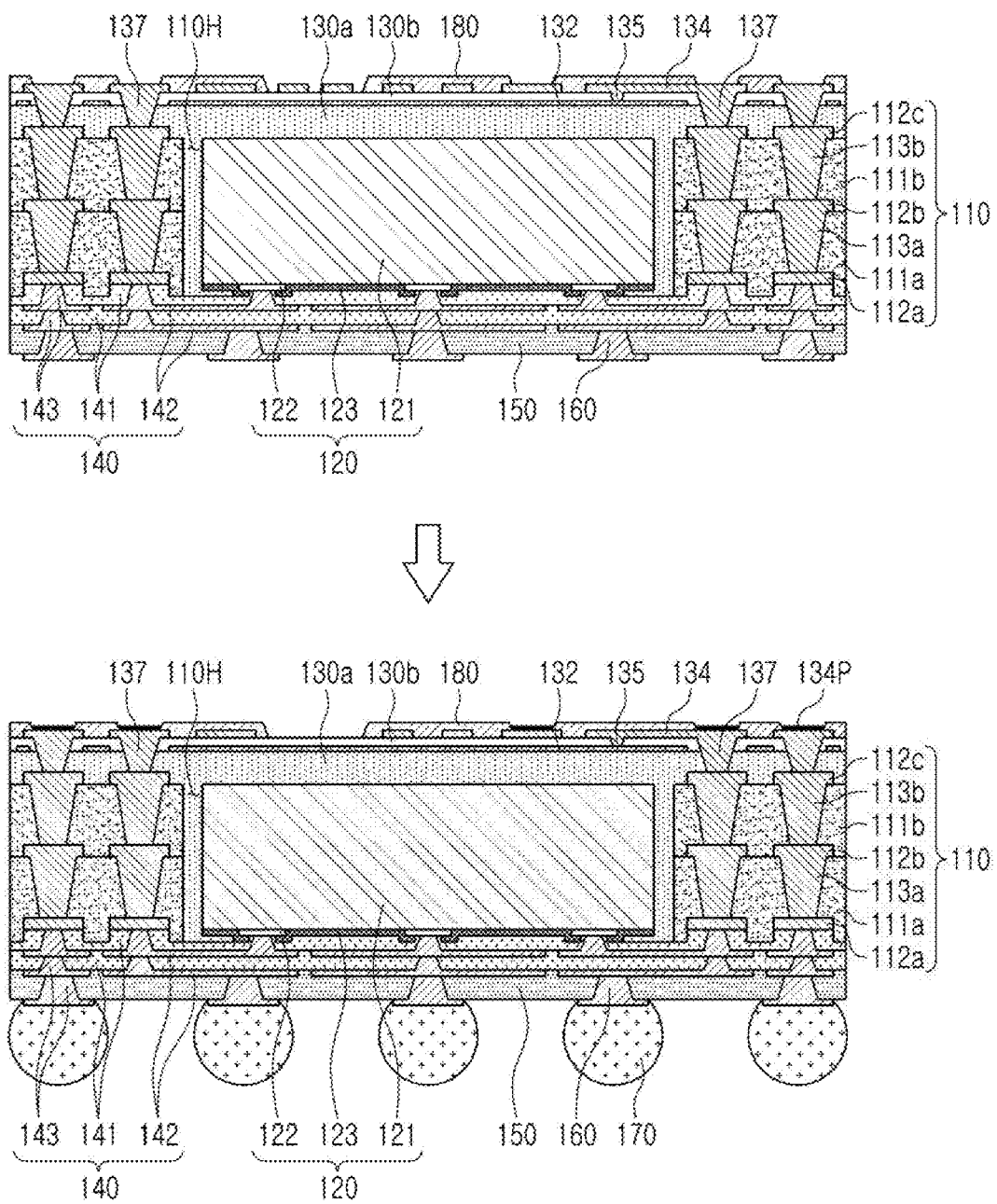

Referring to FIG. 13, a second passivation layer 180 may be formed using ABF or the like, as needed. Further, an opening may be formed in the second passivation layer 180, to open at least a portion of the second passivation layer 180. Next, a surface treatment layer 134P may be formed on an opened surface of the second metal pattern layer 134 by a nickel (Ni)/gold (Au) plating process, as necessary. Further, after the electrical connection metal 170 may be formed on the under-bump metal 160, respectively, a reflow process may be performed. A fan-out semiconductor package 100A according to the above-described example may be manufactured through a series of processes.

Figure 14:
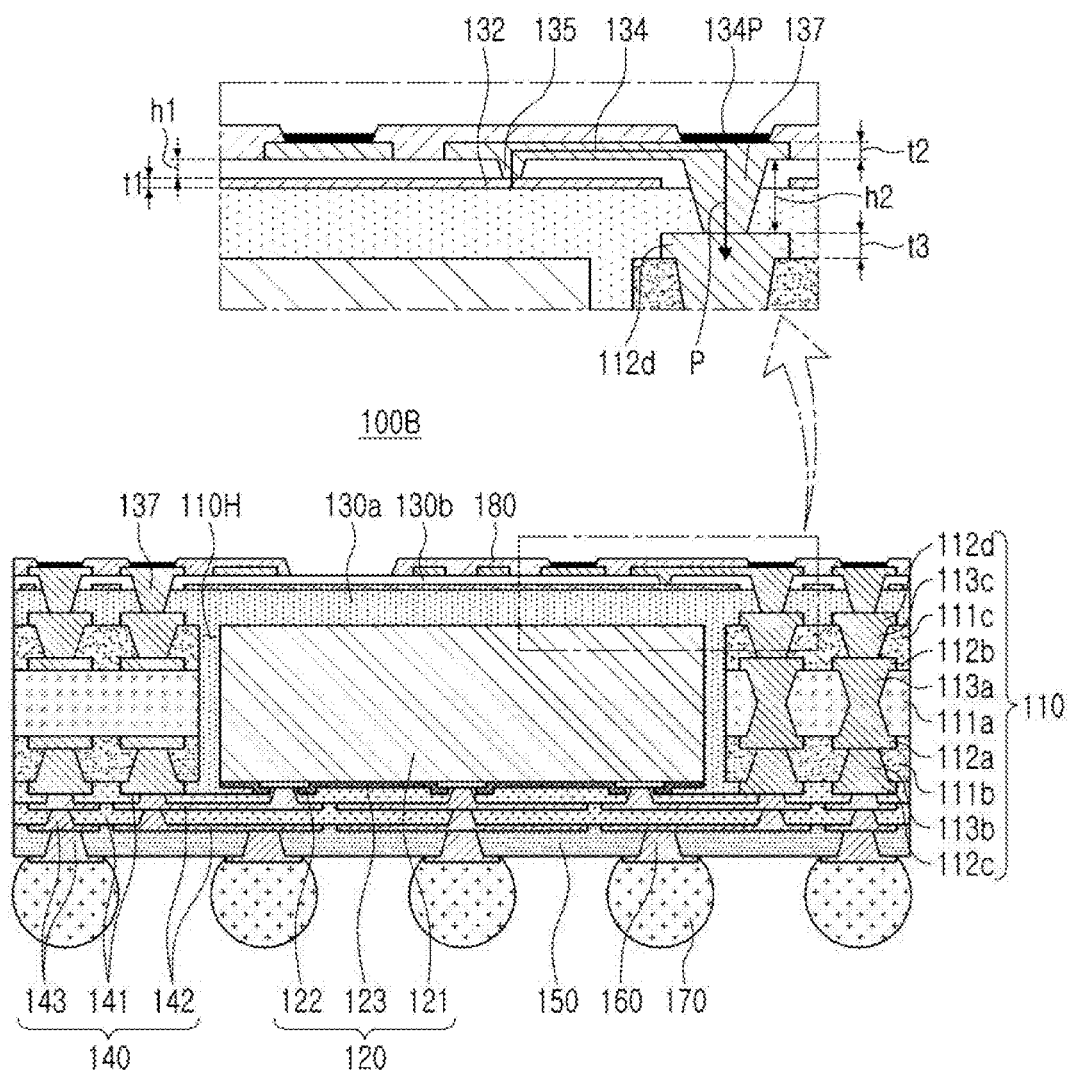
FIG. 14 schematically illustrates another example of a fan-out semiconductor package.

FIG. 14 schematically illustrates another example of a fan-out semiconductor package.

Referring to the drawings, a fan-out semiconductor package 100B according to another example may be different from the frame 110 in the fan-out semiconductor package 100A according to the above-described example. For example, a frame 110 may include a first insulation layer 111*a*; a first wiring layer 112*a* and a second wiring layer 112*b* respectively disposed on both surfaces of the first insulation layer 111*a*; a second insulation layer 111*b* and a third insulation layer 111*c* respectively disposed on both surfaces of the first insulation layer 111*a* and respectively covering the first and second wiring layers 112*a* and 112*b*; a third wiring layer 112*c* disposed on a side of the second insulation layer 111*b*, opposite to a side in which the first wiring layer 112*a* is embedded; a fourth wiring layer 112*d* disposed on a side of the third insulation layer 111*c*, opposite to a side in which the second wiring layer 112*b* is embedded; a first wiring via 113*a* passing through the first insulation layer 111*a* and electrically connecting the first and second wiring layers 112*a* and 112*b*; a second wiring via 113*b* passing through the second insulation layer 111*b* and electrically connecting first and third wiring layers 112*a* and 112*c*; and a third wiring via 113*c* passing through the third insulation layer 111*c* and electrically connecting the second and fourth wiring layers 112*b* and 112*d*. Since the frame 110 has a relatively large number of wiring layers 112*a*, 112*b*, 112*c*, and 112*d*, the connection structure 140 may be further simplified.

The first insulation layer 111*a* may be thicker than the second insulation layer 111*b* and the third insulation layer 111*c*. The first insulation layer 111*a* may be relatively thick to maintain rigidity, and the second insulation layer 111*b* and the third insulation layer 111*c* may be introduced to have a relative large number of wiring layers 112*c* and 112*d*. In a similar manner, the first wiring via 113*a* passing through the first insulation layer 111*a* may be greater in height and average diameter than the second and third wiring vias 113*b* and 113*c* passing through the second and third insulating layers 111*b* and 111*c*. Further, the first wiring via 113*a* may have an hourglass or cylindrical shape, while the second and third wiring vias 113*b* and 113*c* may have tapered shapes opposite to each other. The thickness of each of the wiring layers 112a, 112b, 112c, and 112d may be thicker than the thicknesses t1 and t2 of the first and second metal pattern layers 132 and 134, respectively.

In a fan-out semiconductor package 100B according to another embodiment, a first metal pattern layer 132 may be electrically connected to wiring layers 112a and 112b of a frame 110 by a path P via a second metal pattern layer 134. For example, a fan-out semiconductor package 100B according to another embodiment may further include a first metal via 135 passing through an insulating material 130b and electrically connecting first and second metal pattern layers 132 and 134; and a second metal via 137 passing through an encapsulant 130a and an insulating material 130b and electrically connecting the second metal pattern layer 134 and an uppermost wiring layer 112c. A path P may pass through the first metal pattern layer 132, the first metal via 135, the second metal pattern layer 134, the second metal via 137, and the uppermost wiring layer 112c in sequence, or vice versa. Other details may be substantially the same as those of the fan-out semiconductor package 100A according to the above-described example, and a detailed description thereof will be omitted.

In the present disclosure, the words lower, lower portion, lower surface, and the like are used to refer to the downward direction (in the vertical direction of the drawings, also referred to as the thickness direction) with respect to the cross section of the drawing for convenience, while the words upper, upper portion, upper surface, and the like are used to refer to a direction opposite thereto. It should be understood that, the definitions refer to directions for convenience of explanation, the scope of the claims is not particularly limited by the description of such directions, and the concepts of the upward/downward directions may be changed at any time.

The term of "connect" or "connection" in the present disclosure may be not only a direct connection, but also a concept including an indirect connection through an adhesive layer or the like. In addition, the term "electrically connected" or "electrical connection" means a concept including both a physical connection and a physical non-connection. Also, the expressions of "first," second," etc. are used to distinguish one component from another, and do not limit the order and/or importance of the components. In some cases, without departing from the spirit of the invention, the first component may be referred to as a second component, and similarly, the second component may be referred to as a first component.

The uses of the expression "an example embodiment" used in the present disclosure do not all refer to the same embodiment, but may be provided for emphasizing and explaining different unique features. However, the above-mentioned example embodiments do not exclude that they are implemented in combination with the features of other example embodiments. For example, although the description in the specific example embodiment may be not described in another example embodiment, it may be understood as an explanation related to another example embodiment, unless otherwise described or contradicted by the other example embodiment.

The terms used in the present disclosure are used only to illustrate an example embodiment, and are not intended to limit the present disclosure. At this time, the singular expressions include plural expressions unless the context clearly dictates otherwise.

According to an aspect of the present disclosure, a fan-out semiconductor package having a backside circuit, capable of applying to a package-on-package (POP) structure, capable of ensuring excellent signal and power characteristics, and also capable of securing weight lightening, thinning, shortening, and compactness of the product, may be provided.

While examples have been shown and described above, it will be apparent to those skilled in the art that modifications and variations could be made without departing from the scope of the present invention as defined by the appended claims.

What is claimed is:

1. A fan-out semiconductor package comprising:
   a frame having a through-hole and including one or more wiring layers;
   a semiconductor chip disposed in the through-hole of the frame;
   a connection structure disposed below each of the frame and the semiconductor chip, and including one or more redistribution layers;
   an encapsulant covering an upper surface of each of the frame and the semiconductor chip, and filling a space between a wall surface of the through-hole of the frame and a side surface of the semiconductor chip;
   a first metal pattern layer disposed on an upper surface of the encapsulant;
   an insulating material disposed on the upper surface of the encapsulant and covering the first metal pattern layer;
   a second metal pattern layer disposed on an upper surface of the insulating material; and
   a metal via passing through the insulating material and the encapsulant such that a top end of the metal via is above the first metal pattern layer,
   wherein the metal via electrically connects the second metal pattern layer and the uppermost wiring layer of the frame,
   the first metal pattern layer is located on a level between a lower surface of the second metal pattern layer and an upper surface of an uppermost wiring layer among the one or more wiring layers of the frame, and
   the first metal pattern layer is electrically connected to the uppermost wiring layer by a path via the second metal pattern layer and the metal via.

2. The fan-out semiconductor package according to claim 1, further comprising:
   a first metal via passing through the insulating material and electrically connecting the first and second metal pattern layers,
   wherein the path passes through the first metal via, the second metal pattern layer, and the metal via as a second metal via in sequence, or vice versa.

3. The fan-out semiconductor package according to claim 2, wherein no metal via directly connecting the first metal pattern layer and the uppermost wiring layer is present between the first metal pattern layer and the uppermost wiring layer.

4. The fan-out semiconductor package according to claim 2, wherein the second metal via is higher than the first metal via.

5. The fan-out semiconductor package according to claim 1, wherein the first metal pattern layer is thinner than the uppermost wiring layer.

6. The fan-out semiconductor package according to claim 1, wherein the first metal pattern layer is thinner than the second metal pattern layer.

7. The fan-out semiconductor package according to claim 6, wherein the second metal pattern layer is thinner than the uppermost wiring layer.

8. The fan-out semiconductor package according to claim 1, wherein the semiconductor chip has an active surface on which a connection pad electrically connected to the one or more redistribution layers is disposed, and an inactive surface opposite to the active surface, and the active surface is in contact with the connection structure.

9. The fan-out semiconductor package according to claim 1, further comprising:
a first passivation layer disposed below the connection structure, and having a plurality of first openings for respectively exposing at least a portion of a lowermost redistribution layer among the one or more redistribution layers;
a plurality of under-bump metal bumps respectively disposed on the plurality of first openings and electrically connected to the lowermost redistribution layer, respectively; and
a plurality of electrical connection metal bumps disposed below the first passivation layer and electrically connected to the plurality of under-bump metal bumps, respectively.

10. The fan-out semiconductor package according to claim 9, further comprising a second passivation layer disposed on the upper surface of the insulating material, covering the second metal pattern layer, and having a plurality of second openings respectively opening at least a portion of the second metal pattern layer.

11. The fan-out semiconductor package according to claim 1, wherein the frame comprises a first insulation layer contacting the connection structure; a first wiring layer contacting the connection structure and embedded in the first insulation layer; a second wiring layer disposed on a side of the first insulation layer, opposite to a side in which the first wiring layer is embedded; a second insulation layer disposed on the first insulation layer and covering the second wiring layer; and a third wiring layer disposed on a side of the second insulation layer, opposite to a side in which the second wiring layer is embedded,
wherein the first to third wiring layers are electrically connected to the one or more redistribution layers.

12. The fan-out semiconductor package according to claim 1, wherein the frame comprises a first insulation layer; first and second wiring layers respectively disposed on both surfaces of the first insulation layer; second and third insulation layers respectively disposed on both surfaces of the first insulation layer and respectively covering the first and second wiring layers; a third wiring layer disposed on a side of the second insulation layer, opposite to a side in which the first wiring layer is embedded; and a fourth wiring layer disposed on a side of the third insulation layer, opposite to a side in which the second wiring layer is embedded,
wherein the first to fourth wiring layers are electrically connected to the one or more redistribution layers.

13. The fan-out semiconductor package according to claim 1, wherein the first metal pattern layer is spaced apart from the metal via penetrating in the encapsulant.

14. A fan-out semiconductor package comprising:
a frame having a through-hole and including one or more wiring layers;
a semiconductor chip disposed in the through-hole of the frame;
a connection structure disposed below each of the frame and the semiconductor chip, and including one or more redistribution layers;
an encapsulant covering an upper surface of each of the frame and the semiconductor chip, and filling a space between a wall surface of the through-hole of the frame and a side surface of the semiconductor chip;
a first metal pattern layer disposed on an upper surface of the encapsulant;
an insulating material disposed on the upper surface of the encapsulant and covering the first metal pattern layer; and
a second metal pattern layer disposed on an upper surface of the insulating material,
wherein the first metal pattern layer is located on a level between a lower surface of the second metal pattern layer and an upper surface of an uppermost wiring layer among the one or more wiring layers of the frame,
the first metal pattern layer is electrically connected to the uppermost wiring layer by a path via the second metal pattern layer,
the first metal pattern layer comprises a ground pattern, rather than a signal pattern,
the second metal pattern layer comprises a ground pattern and a signal pattern, and
the uppermost wiring layer comprises a ground pattern and a signal pattern.

15. The fan-out semiconductor package according to claim 14, wherein the ground pattern of the first metal pattern layer is electrically connected to the ground pattern of the uppermost wiring layer by a path via the ground pattern of the second metal pattern layer.

16. The fan-out semiconductor package according to claim 14, wherein a planar area of the first metal pattern layer covering the upper surface of the encapsulant is larger than a planar area of the second metal pattern layer covering the upper surface of the insulating material.

17. A fan-out semiconductor package comprising:
a connection structure including one or more redistribution layers;
a semiconductor chip disposed on the connection structure and having connection pads electrically connected to the one or more redistribution layers;
an electrical connection member disposed on the connection structure, and electrically connected to the one or more redistribution layers by a vertical electrical connection path;
an encapsulant disposed on the connection structure and covering at least a portion of each of the semiconductor chip and the electrical connection member;
a first metal pattern layer disposed on the encapsulant;
an insulating material disposed on the encapsulant and covering the first metal pattern layer;
a second metal pattern layer disposed on the insulating material; and
a metal via passing through the insulating material and the encapsulant such that a top end of the metal via is above the first metal pattern layer,
wherein the metal via electrically connects the second metal pattern layer and the connection structure,
wherein the first metal pattern layer is located on a level between a lower surface of the second metal pattern layer and an upper surface of the electrical connection member, and
the first metal pattern layer is electrically connected to the electrical connection member by a path via the second metal pattern layer and the metal via.

18. The fan-out semiconductor package according to claim 17, wherein the first metal pattern layer is thinner than the uppermost wiring layer among wiring layers of the electrical connection member.

19. The fan-out semiconductor package according to claim 17, wherein the first metal pattern layer is thinner than the second metal pattern layer.

20. The fan-out semiconductor package according to claim 19, wherein the second metal pattern layer is thinner than the uppermost wiring layer among wiring layers of the electrical connection member.

\* \* \* \* \*